United States Patent [19]

Liebmann et al.

[11] Patent Number: 5,657,235
[45] Date of Patent: Aug. 12, 1997

[54] CONTINUOUS SCALE OPTICAL PROXIMITY CORRECTION BY MASK MAKER DOSE MODULATION

[75] Inventors: Lars Wolfgang Liebmann, Dutchess County, N.Y.; Ronald Michael Martino, Fairfield, Conn.; J. Tracy Weed, Dutchess County, N.Y.

[73] Assignee: International Business Machines Corporation, Armonk, N.Y.

[21] Appl. No.: 434,089

[22] Filed: May 3, 1995

[51] Int. Cl.[6] .......................... G03F 1/00; H01L 21/027; H01J 37/304
[52] U.S. Cl. ............... 364/474.24; 395/500; 250/492.22; 364/468.28
[58] Field of Search .................... 364/474.05, 491, 364/148, 191, 490, 498, 130, 512, 515, 468.28, 474.24, 474.25; 250/492.2

[56] References Cited

U.S. PATENT DOCUMENTS

| | | | |
|---|---|---|---|
| 4,456,371 | 6/1984 | Lin | 430/5 |
| 4,895,780 | 1/1990 | Nissan-Cohen et al. | 430/5 |
| 5,208,124 | 5/1993 | Sporon-Fiedler et al. | 430/5 |
| 5,242,770 | 9/1993 | Chen et al. | 430/5 |
| 5,278,421 | 1/1994 | Yoda et al. | 250/492.22 |
| 5,294,800 | 3/1994 | Chung et al. | 250/492.2 |
| 5,553,274 | 9/1996 | Liebmann | 395/500 |

OTHER PUBLICATIONS

Richard C. Henderson and Oberdan W. Otto, "CD Data Requirements for Proximity effect corrections," 14th Annual BACUS Symposium Proc. SPIE 2322 1994 pp. 218–228.
Oberdan W. Otto, et al., "Automated Optical Proximity Correction-a rules-based Approach," Optical/Laser Microlithography VII, Proc. SPIE 2197 1994 pp. 278–293.
John P. Stirniman and Michael L. Rieger, "Fast Proximity correlation with zone sampling," Optical/Laser Micro. VII, Proc. SPIE 2197 1994 pp. 294–301.
John P. Stirniman and Michael Rieger, "Optimizing Proximity correction for water fabrication process," 14th Annual BACUS Symposium Proc. SPIE 2322 1994 pp. 239–246.
David J. Elliot, "Integrated Circuit Fabrication Technology" Second Edition pp. 235–236 (no date).
Peter Buck and Brian Grenon, "A COmparison of Wet and Dry Chrome Etching with the Core-2564" SPIE vol. 2087 1993 pp. 42–49.
"Across Chip Line Width Variation" SPIE vol. 2322 1994 pp. 230–238.

*Primary Examiner*—Paul P. Gordon
*Assistant Examiner*—McDieunel Marc
*Attorney, Agent, or Firm*—Witham, Curtis, Whitham & McGinn; Charles W. Peterson, Jr.

[57] ABSTRACT

Energy levels (dose) are manipulated to modify the resultant photomask representation in a controlled manner such that the final image in the semiconductor device fabrication is close to an ideal image. Feature sizes and shapes are modified by assigning relative mask writer doses rather than physically manipulating feature sizes in layout designs. This approach, based on coding of relative dose information onto the design data, allows continuous scale line width variation for all features without impact to data volume. Two embodiments are described. In the first embodiment, distortion knowledge in the form of a lookup table or convolution function is applied to CAD data which is fractured into numerous designs having specific dose assignments. In the alternative embodiment, distortion knowledge in the form of a lookup table or convolution function is applied to CAD data which generates an attribute file containing hierarchical dose information that is mapped onto the mask data. Both embodiments compensate specific mask feature sizes through dose offsets during the mask exposure process.

8 Claims, 9 Drawing Sheets

CONTINUOUS SCALE OPTICAL PROXIMITY CORRECTION BY MASK MAKER DOSE MODULATION

CROSS-REFERENCE TO RELATED APPLICATION

The invention disclosed herein is related in subject matter to the patent application of Lars W. Liebmann entitled "Vertex Minimization in a Smart Optical Proximity Correction System", Ser. No. 08/470,728, filed Apr. 17, 1995, now U.S. Pat. No. 5,553,274 and assigned to a common assignee with this application. The disclosure of U.S. Pat. No. 5,553,274 is incorporated herein by reference.

DESCRIPTION

BACKGROUND OF THE INVENTION

1. Field of the Invention

The present invention generally relates to the manufacture of very large scale integrated (VLSI) circuit devices and, more particularly, to the coding of relative dose information onto design data to allow continuous line width variation for all features without impact to data volume.

2. Background Description

Manufacturing of semiconductor devices is dependent upon the accurate replication of computer aided design (CAD) generated patterns onto the surface of a device substrate. The replication process is typically performed using optical lithography followed by a variety of subtractive (etch) and additive (deposition) processes. Optical lithography patterning involves the illumination of a metallic coated quartz plate known as a photomask which contains a magnified image of the computer generated pattern etched into the metallic layer. This illuminated image is reduced in size and patterned into a photosensitive film on the device substrate.

As a result of the interference and processing effects which occur during pattern transfer, images formed on the device substrate deviate from their ideal dimensions and shape as represented by the computer images. These deviations depend on the characteristics of the patterns as well as a variety of process conditions. Because these deviations can significantly effect the performance of the semiconductor device, many approaches have been pursued which focus on CAD compensation schemes which ensure a resultant ideal image.

The performance enhancement of advanced VLSI circuitry (that is, the speed enhancement versus dimension reduction of the circuits) is increasingly limited by the lack of pattern fidelity in a series of lithography and RIE processes at small dimensions (e.g., sub 0.5 μm). In the photolithography process, a pattern is transferred from a photo mask to a photosensitive film (resist) on the wafer. In the RIE process, this pattern in the resist is transferred into a variety of films on the wafer substrate.

An alternative to the costly development of processes with ever higher effective resolution is the selective biasing of mask patterns to compensate for the pattern distortions occurring during wafer processing. The term Optical Proximity Correction (OPC) is commonly used to describe this process of selective mask biasing, even though the trend exists to include pattern distortions unrelated to the optical image transfer. The idea of biasing patterns to compensate for image transfer infidelities has been commonly applied to E-beam lithography to counteract the effects of back scattered electrons, both in the writing of photo masks and in direct wafer writing operations. See for example U.S. Pat. No. 5,278,421.

OPC extends the use of the automatic pattern biasing concept to the two major pattern transfer processes used in VLSI technologies. Current implementations of OPC can be categorized as "rules-based" in which patterns are sorted and biased in the computer aided design (CAD) data set based on rules relating bias amounts to pattern attributes such as size, proximity, and density, and "convolution-based" in which CAD patterns are biased based on particular pattern environment. Both the rules and convolution functions can be generated either from process simulations or from empirical data. For examples of "rules-based" OPC implementations, see Richard C. Henderson and Oberdan W. Otto, "CD data requirements for proximity effect corrections", 14*th Annual BACUS Symposium on Photomask Technology and Management*, William L. Brodsky and Gilbert V. Shelden, Editors, Proc. SPIE 2322 (1994), pp.218–228, and Oberdan W. Otto, Joseph G. Garofalo, K. K. Low, Chi-Min Yuan, Richard C. Henderson, Christophe Pierrat, Robert L. Kostelak, Shiela Vaidya, and P. K. Vasudev, "Automated optical proximity correction—a rules-based approach", *Optical/Laser Microlithography VII*, Timothy A. Brunner, Editor, Proc. SPIE 2197 (1994), pp. 278–293. For examples of the "convolution-based" OPC implementations, see John P. Stirniman and Michael L. Rieger, "Fast proximity correlation with zone sampling", *Optical/Laser Microlithography VII*, Timothy A. Brunner, Editor, Proc. SPIE 2197 (1994), pp. 294–301, and John Stirniman and Michael Rieger, "Optimizing proximity correction for wafer fabrication processes", 14*th Annual BACUS Symposium on Photomask Technology and Management*, William L. Brodsky and Gilbert V. Shelden, Editors, Proc. SPIE 2322 (1994), pp. 239–246.

These compensation schemes have concentrated on manipulation of the computer representations by adding, subtracting, or biasing design features. Modification of the designs with computer programs have become routine; however, the manufacturing of the photomask to acceptable criteria has proven to be difficult due to image fidelity and data processing constraints. These constraints arise due to the relationship of the allowable compensation increments in the design of the photomask data volumes and processing times. Reduced design compensation increments increase data volumes and processing times, making some designs extremely difficult and costly to replicate. On the other hand, compensation increments which are too large will not allow for acceptable corrections to the final image, producing a nonfunctional or poorly performing device.

In a typical compensation scheme, CAD data in a hierarchical format using a discrete design grid is created which represents the ideal device patterns. Compensation information based on known patterning distortions is defined in a "lookup" table or convolution function. Manipulation of the CAD data based on the distortion knowledge is performed within an optical proximity correction (OPC) engine which outputs biased CAD data. The output data contains reduced hierarchy and design grid in order to allow for the appropriate compensations. The biased CAD data is then converted to a flat format for photomask fabrication.

Constraints which exist with design system manipulation and pattern replication are driving the consideration of other methods of correction such as mask process compensation. The process of fabricating a mask involves patterning a computer designed image onto the metallic layer of a photomask. This is accomplished by coating the metallic surface of the photomask with a polymer film which is sensitive to incident electron energy or optical exposure, depending on the type of exposure system. The coated photomask blank is placed in the exposure system which draws the pattern based on a digitized formal of the CAD layout which instructs the exposure system to turn on or turn off energy. The resultant photomask contains a polymer film with irradiated areas that correspond to the CAD data. Due to the chemical make-up of the polymer, a reaction occurs in these areas that change the polymer solubility relative to the non-irradiated regions. By placing the photomask into an appropriate solution, the irradiated polymer can be removed while retaining the non-irradiated region. This process is known as developing. It is possible to remove the non-irradiated area if a polymer is selected with the appropriate chemistry. Following this process, a second chemical step can be used to remove the uncovered metallic region, known as etching, leaving only an image of the CAD representation of the device layer on the photomask.

Within this process, many parameters effect the size of images created, such as incident energy level, duration of development, or duration of the etch step. Processes such as development or etch effect all regions of the photomask and are used to adjust the average size of all the features contained in the design. Energy level or does is controlled by the exposure system which can selectively apply an energy level to any particular pattern needing compensation. It has been shown that a linear region exists for image size control as a function of dose making selective process biasing possible.

Current approaches, based on the modification of the CAD data set, are intrinsically confined to the granularity of the minimum addressable design grid allowed by the mask maker. A design grid of 1/40 µm is an aggressive design, limiting the minimum displacement of any feature edge to 25 nm. A requirement by chip designers to fix the center line of all features dictates that two edges of a line have to be shifted simultaneously in opposite directions, further limiting the minimum change in feature size to 50 nm. As a reference, 50 nm constitutes the entire line width tolerance budget for the 250 nm technologies (e.g., 256MB DRAMs), making line width control to 50 nm biasing impossible. Reducing the grid size to smaller than 1/40 µm grid has tremendous impact on data volume and mask write times, making it impossible to write full product chips on current mask writers at anything smaller than 1/80 µm grid size. Biasing line widths at 25 nm granularity will still not achieve the required level of line width control.

In addition to data volume increases caused by a decrease in allowable address size (design grid), data unnesting (loss of hierarchical data structure), unavoidable to a certain degree in design data manipulation based on OPC, also increases data volume both for design systems and postprocessing tools.

SUMMARY OF THE INVENTION

It is therefore an object of the present invention to provide a system for manipulating energy levels (dose) to modify the resultant photomask representation in a controlled manner such that the final image in the semiconductor device fabrication is close to an ideal image.

According to the invention, there is provided a solution to the limitations associated with design grid based OPC by modifying feature sizes and shapes by assigning relative mask writer doses rather than physically manipulating feature sizes in layout designs. This approach, based on coding of relative dose information onto the design data, allows continuous line width variation for all features without impact to data volume. The general concept is described in two embodiments; a first embodiment involving the application of distortion knowledge in the form of a lookup table or convolution function to CAD data which fractures the data into numerous designs having specific dose assignments and an alternative embodiment involving the application of distortion knowledge in the form of a lookup table or convolution function to CAD data which generates an attribute file containing hierarchical dose information that is mapped onto the mask data. Both embodiments of the invention compensate specific mask feature sizes through dose offsets during the mask exposure process. These offsets are given relative to a nominal dose that has been established for a given exposure system and patterning material. Offsets are based on a characterized response function of line width versus dose increments which are specific to a given exposure system and patterning material. This function is commonly generated in a mask facility during process development and is readily available in a mask manufacturing line. Feature manipulation such as the addition of serifs at the ends of lines can be handled in a similar scheme which modifies the energy level at a specific location of a features.

The major advantages of the present invention are the following:

The granularity of the required OPC is decoupled from the design grid, allowing feature biasing at near continuous scale.

A direct link from OPC programs to data postprocessors allow any data unnesting associated with the OPC to occur at the last possible moment, streamlining the data handling process.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
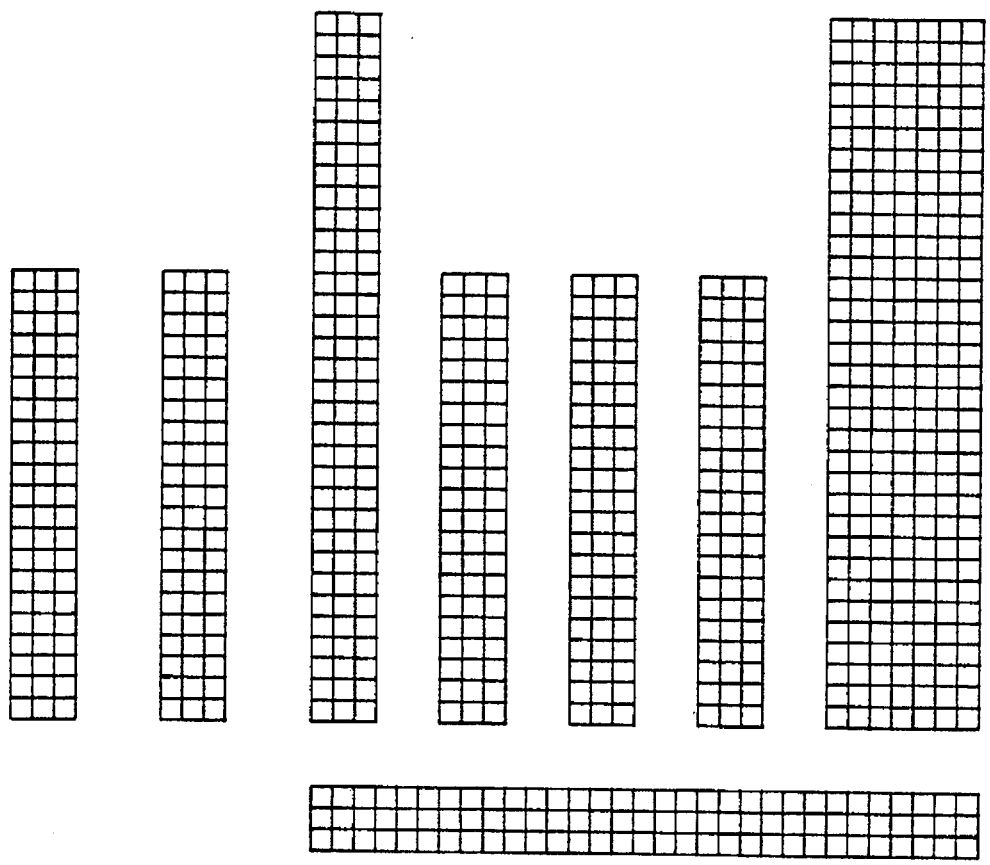
FIG. 1A is an example of a typical design pattern which is to be patterned on a photosensitive film on a device substrate.
Figure 1B:
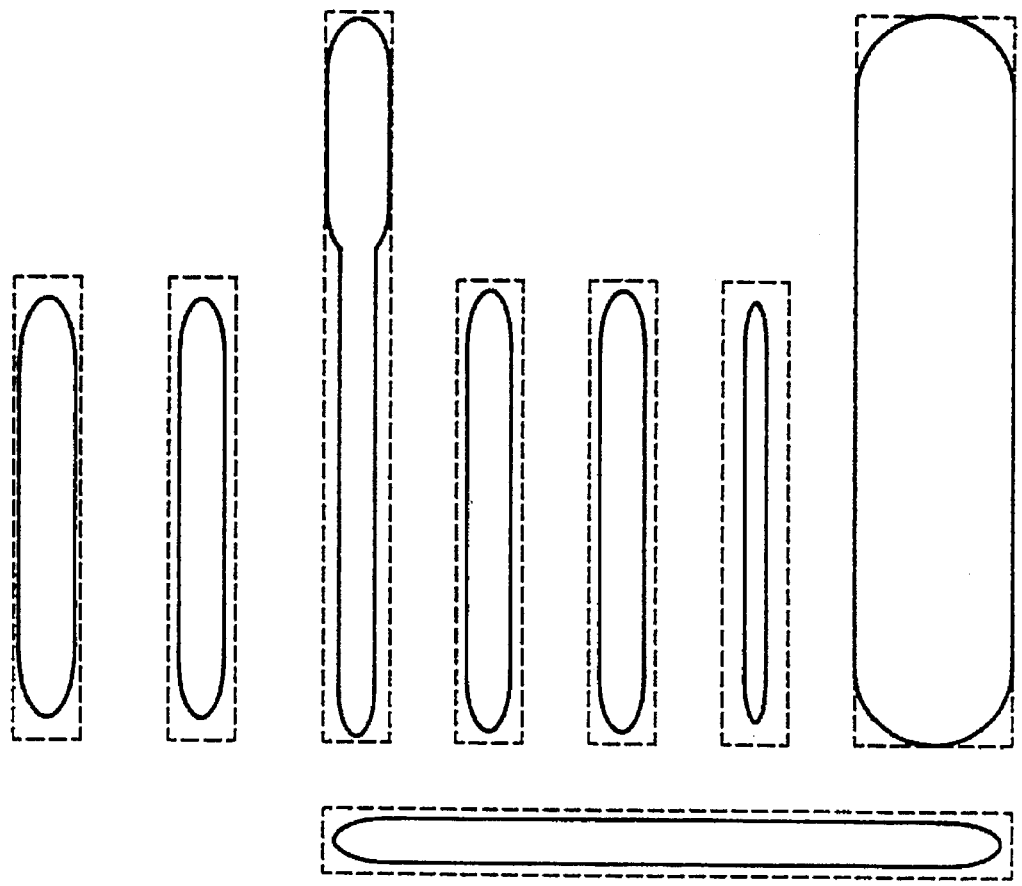
FIG. 1B is the resulting pattern as patterned on the photosensitive film without optical proximity correction.
Figure 2:
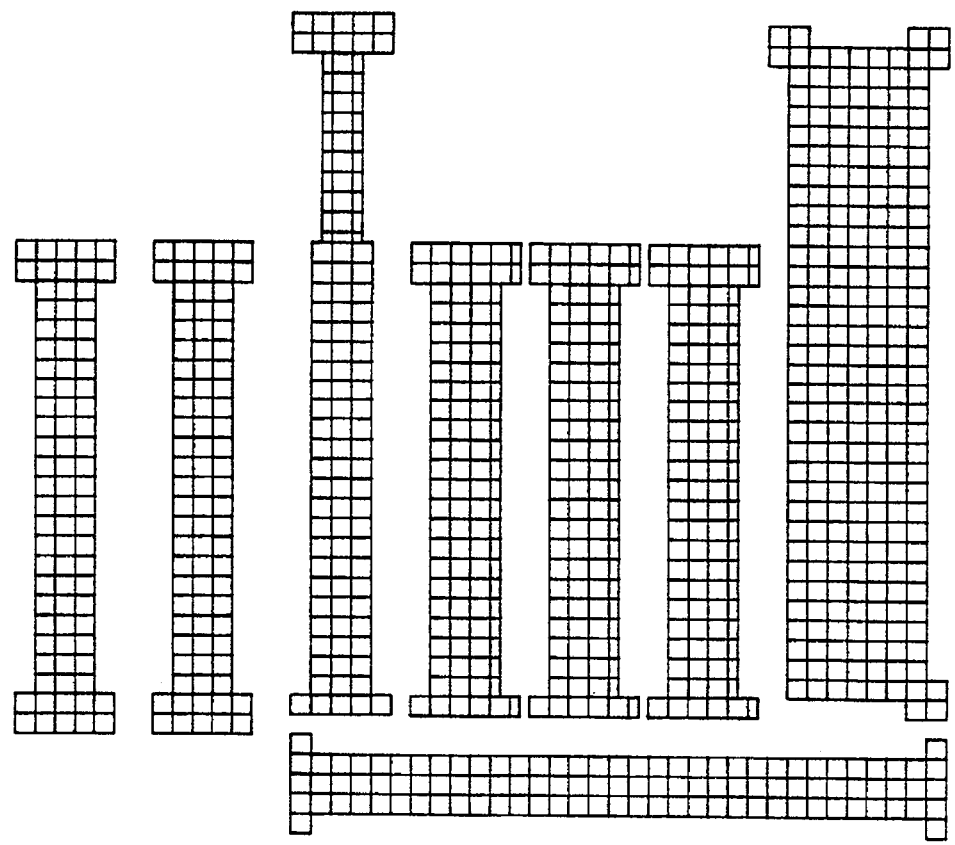
FIG. 2 is an illustration of the original design pattern shown in FIG. 1A modified using conventional optical proximity correction.

Referring now to the drawings, and more particularly to FIG. 1A, there is shown an example of a typical design pattern which is to be patterned on a photosensitive film on a device substrate. Without optical proximity correction (OPC), the resulting pattern as patterned on the photosensitive film is shown in FIG. 1B. Not that the features of the pattern are foreshortened, have their corners rounded, and are variously shrunk in width depending on the proximity of adjacent features. To compensate for these distortions, conventional OPC selectively biases the original pattern design by adding serifs and additional width and length to the features, as shown in FIG. 2, so that the resulting pattern on the photoresist will more closely replicate the original design shown in FIG. 1A.

Figure 3:
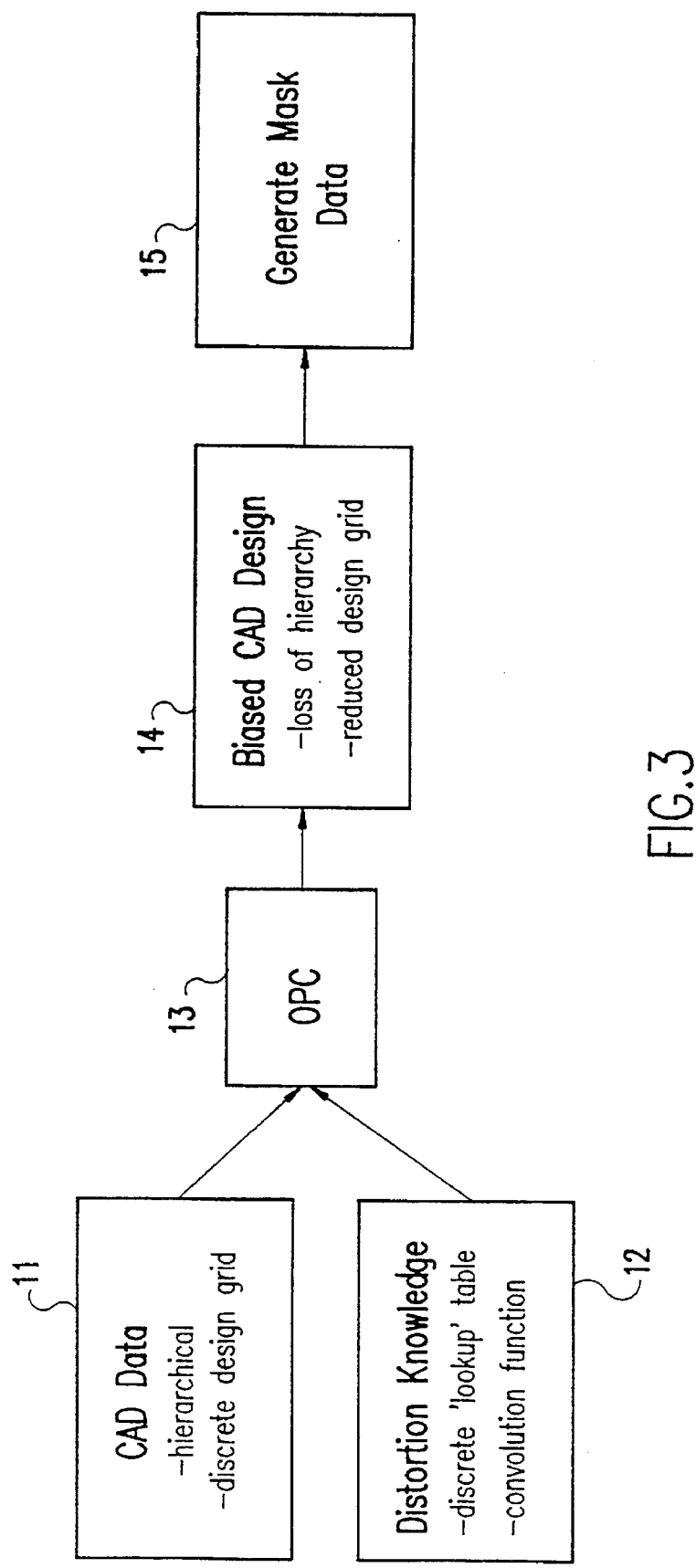
FIG. 3 is a block diagram showing a current implementation of optical proximity correction in the generation of mask data.

FIG. 3 shows a current OPC implementation wherein CAD data 11, in a hierarchical format using a discrete design grid, is input to the OPC engine 13. The OPC engine 13 also receives distortion knowledge 12, which may be from a lookup table or a convolution function as described in the literature cited above. This distortion knowledge is created through experimental analysis or theoretical calculations of the patterning process. The knowledge specifically quantifies the size of a specific CAD feature in its final form or the wafer prior to any compensation scheme such as grid based manipulation or manipulation as described in this invention. The specific features are analyzed based on varying dimensions, distance to nearest neighbor, etch loading environments, or any pattern transfer parameter which effects a specific shape's character. A table or function is generated based on the feature analysis which describes required deviations for any feature in the CAD data. The OPC engine 13 applies the deviations to the CAD data features through shape manipulation of the CAD data. These deviations or compensations are limited to two times the minimum grid increment on which the CAD data is defined. Use of a single grid increment would cause a shift of a compensated feature relative to an uncompensated feature due to the shifting of only a single edge of the image. This is unacceptable in semiconductor manufacturing. Definition of images smaller than a single grid increment is restricted by design system methodology, and reduction of the grid increment negatively effects the mask data generation, mask exposure system, and inspection systems.

The negative effects arise from several changes which occur within the CAD data due to compensation of features. This is observed in the biased CAD data 14 which is the output of the OPC engine 13. Within the design, a pattern can be replicated multiple times in a hierarchical format by referencing a single pattern. This requires that the replicated pattern be identical at any point in the design. When a pattern requires a compensation specific to its location or environment, a new pattern must be generated. This reduces the amount of replications and increases the number of patterns which must be defined within the CAD data. This is known as a reduction of hierarchy and increases the size of the data set. In addition to this, a reduced design grid is required to allow for acceptable compensation increments. The design grid effects the size of the mask data 15 which is used by the exposure tool. In a raster exposure system, data segments are defined which are referred to as write scans. These are defined by a specific number of grid units in a two dimensional layout. As the design grid increment decreases, more write scan definitions are needed to describe a design of fixed dimensions. Both the reduced hierarchy and the reduced grid increment result in larger mask data volumes and write scan definitions which effect the speed and ability of replicating a given design.

Figure 4:
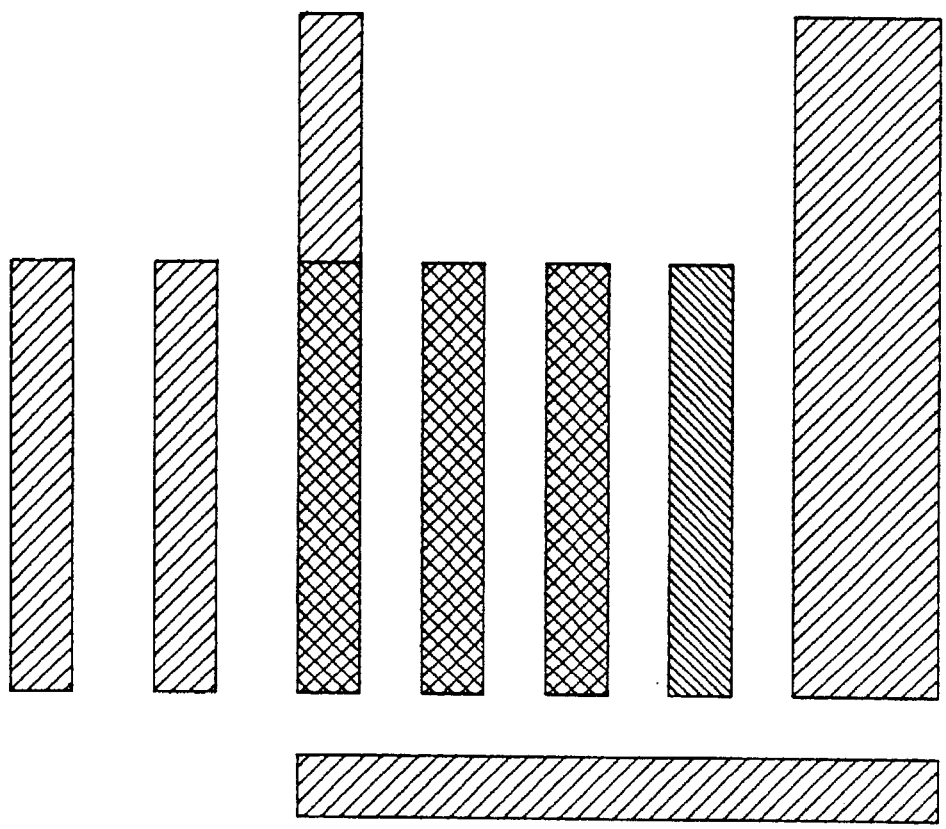
FIG. 4 is a representation of an attribute file containing dose offset information for the mask writer according to the invention.
Figure 5A:
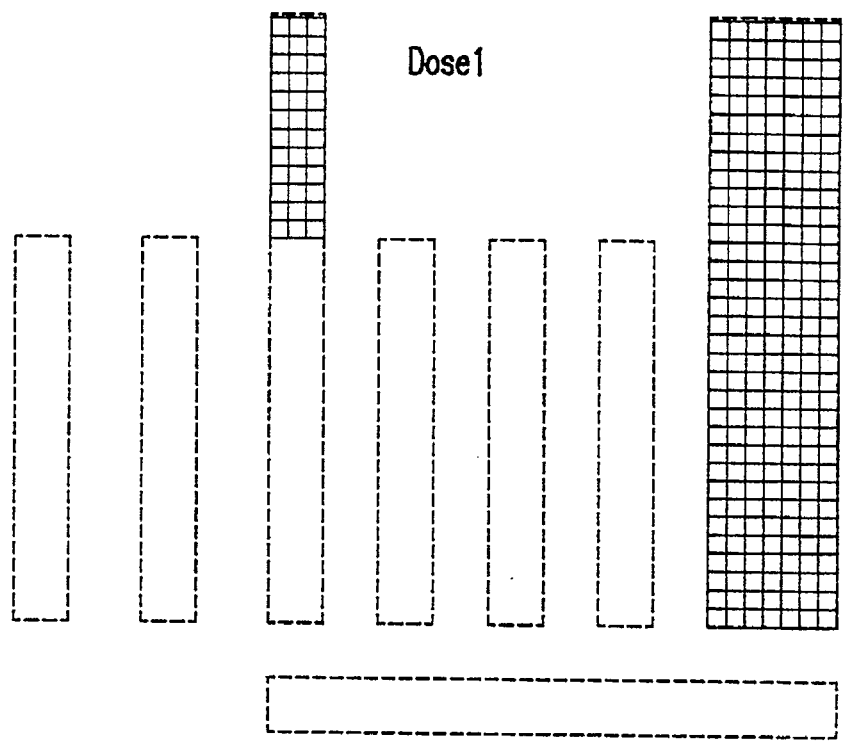
FIGS. 5A, 5B, 5C, and 5D illustrate the application of different doses to fractured design data.
Figure 5B:
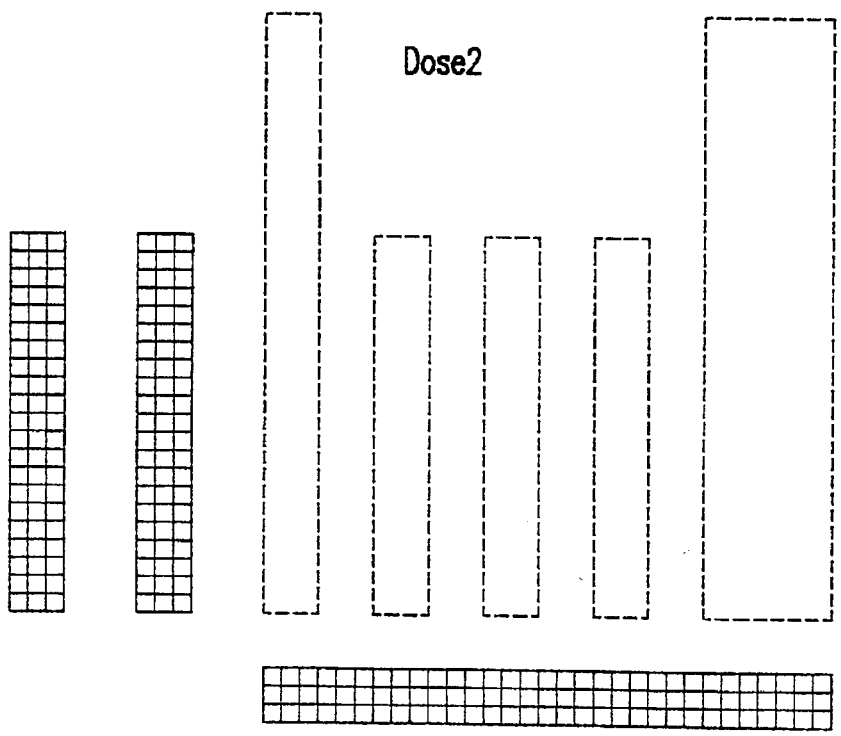
Figure 5C:
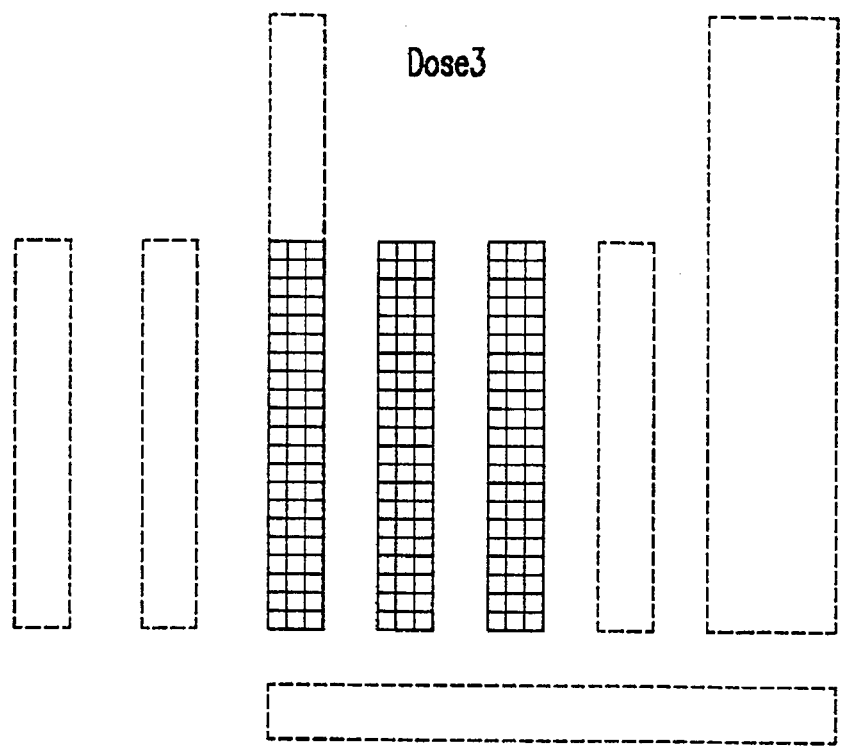
Figure 5D:
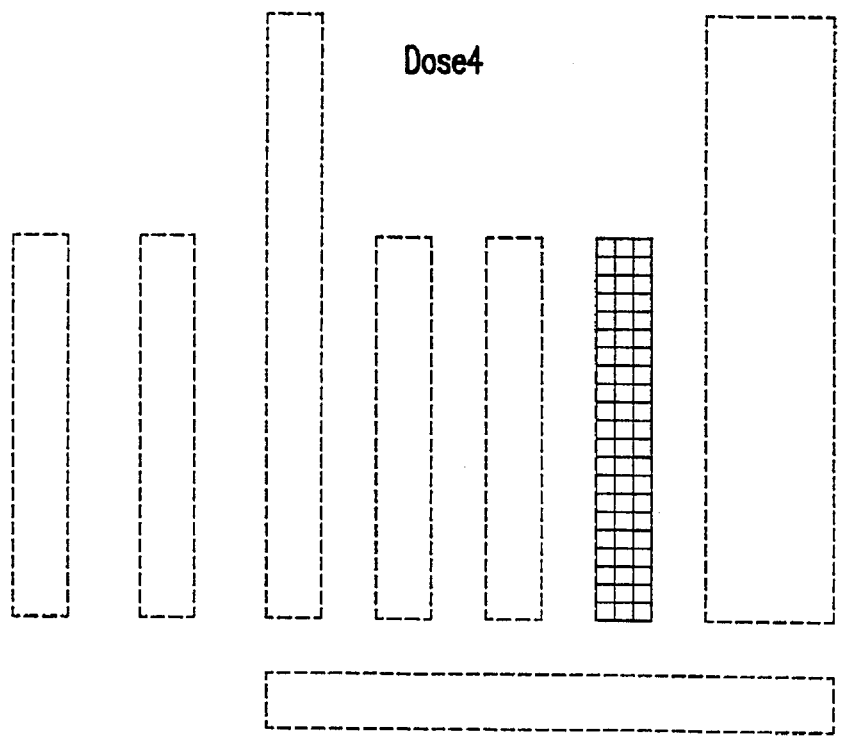

In the practice of the present invention, instead of generating a biased CAD design as in the current OPC implementation, the original design pattern data is modified to generate an attribute file containing dose offset information for the mask writer. A representation of this attribute file is illustrated in FIG. 4 where the four different shadings indicate four different dose levels. The use of this attribute file is illustrated in FIGS. 5A to 5D. Each dose is successively applied to the shaded features to produce the desired compensated pattern on the photoresist. It will, of course, be understood that the practice of the invention is not limited to the four doses illustrated in the example.

Figure 6:
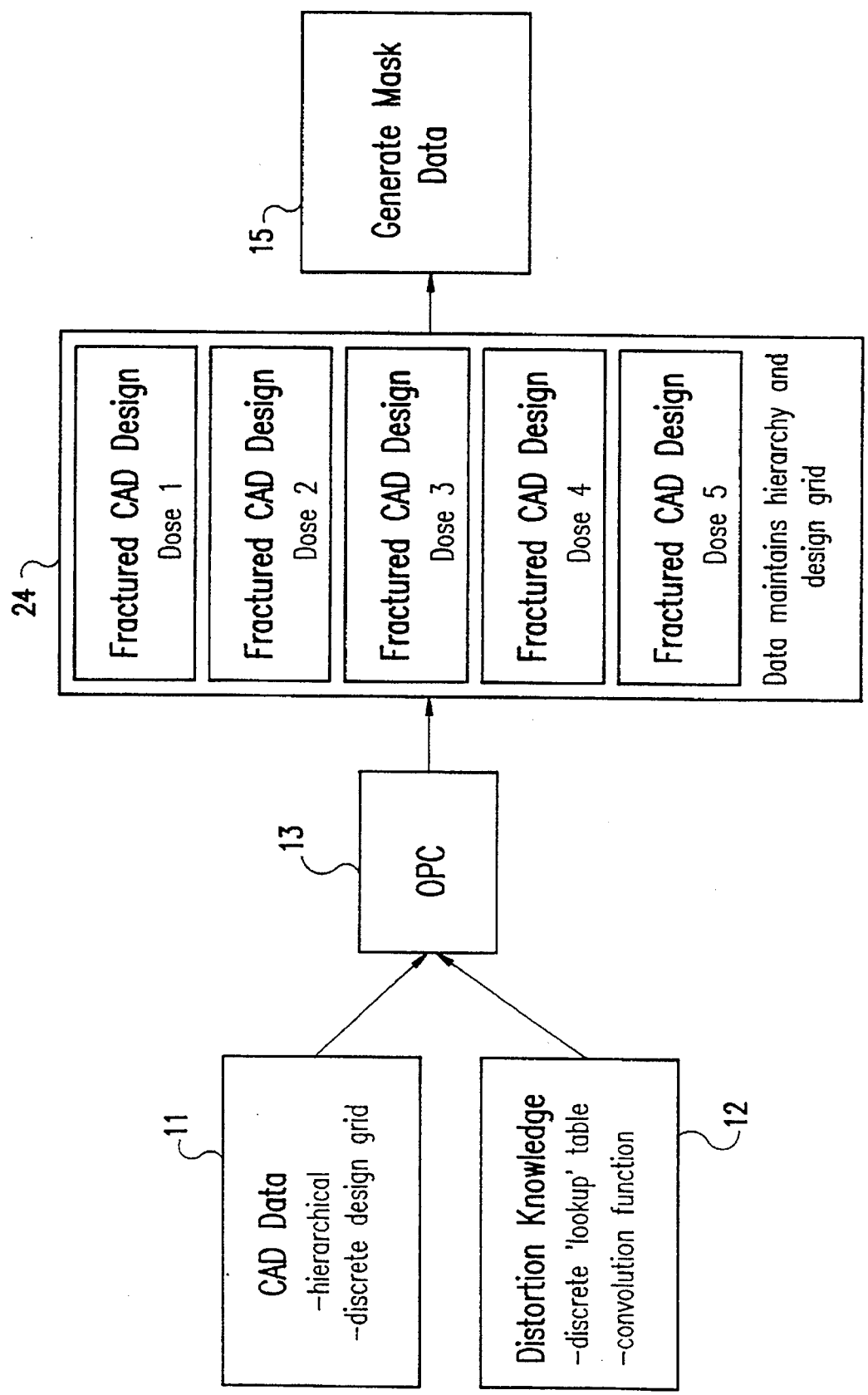
FIG. 6 is a block diagram showing an embodiment of the invention.

In the practice of the invention, the OPC engine 13 fractures the original CAD design into a plurality of levels, generally indicated at 24 in FIG. 6, each requiring a specific compensation. The manner in which fracturing is accomplished is disclosed in U.S. Pat. No. 5,553,274, supra. These subsets are described by unique data level names and all retain the original design grid increment allowing for hierarchy retention and prevention of data volume increases. Data level naming is common to all CAD based systems. Each unique data level has a specific dose assignment with which it is associated, here denominated as Dose 1 to Dose 5 in FIG. 6. These dose assignments are based on the distortion knowledge 12 and a knowledge of the dose relationship to compensation level. The dose relationship is readily available as described above and can be combined as part of the lookup table or convolution function. The resultant mask data consists of multiple groups of data patterns, each requiring a specific and unique dose. These groups are then exposed in sequence at the appropriate location of the photomask with the appropriate energy level as described by an instruction file for the exposure system. The modified current levels produces image compensations which are orders of magnitude smaller than that which is achievable with CAD based biasing. The present invention allows for a continuous scale of compensation increments for the correction of image distortion which is not achievable in current OPC implementations due to discrete grid limitations and excessive mask process costs and times.

Figure 7:
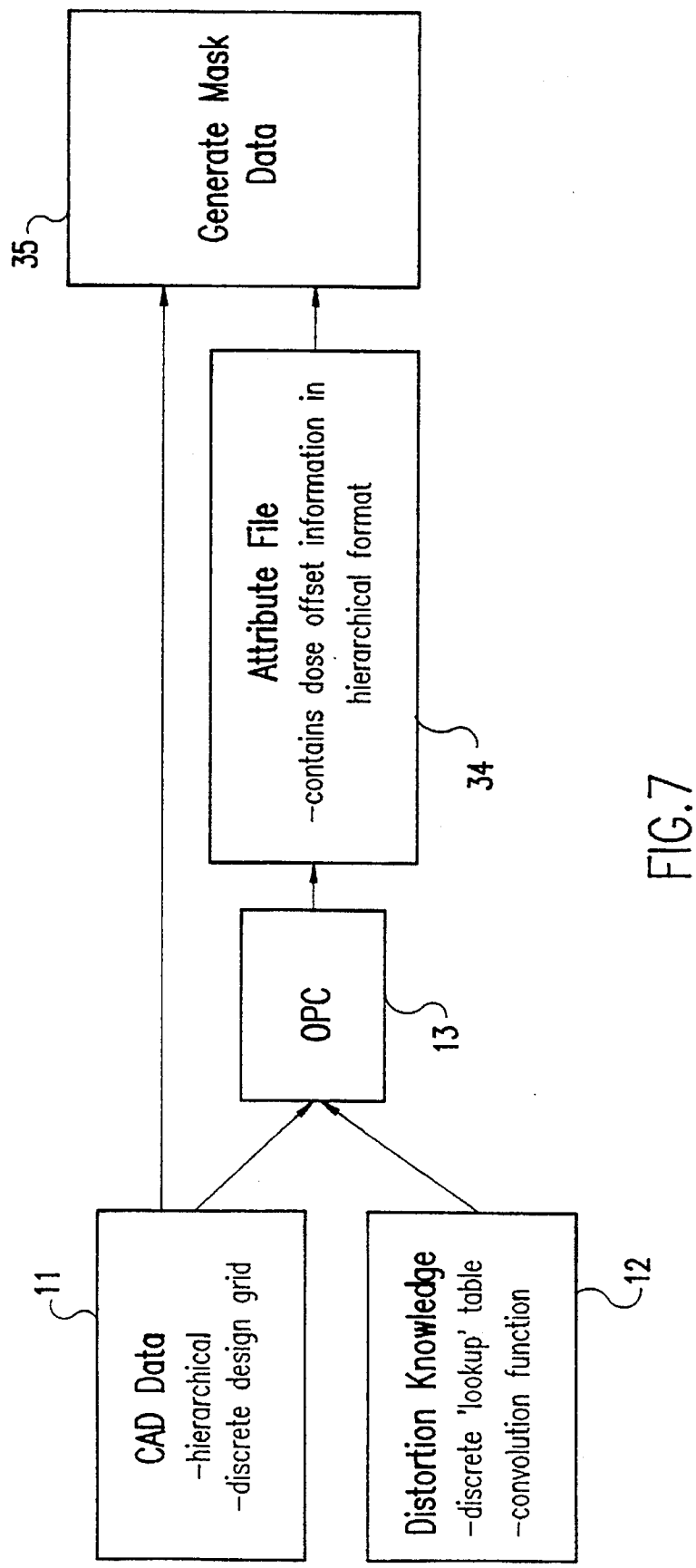
FIG. 7 is a block diagram showing an alternate embodiment of the invention.

In an alternate embodiment shown in FIG. 7, the original CAD data 11 is supplied directly to the generation of the mask data function 35 together with the output of an attribute file 34. In this case, the OPC engine 13 uses the CAD data and the distortion knowledge 12 to define a hierarchical dose offset assignment file which is mapped against the CAD data during mask data generation. The hierarchy of the dose offset information matches that of the CAD data for each mapping. The mask exposure level is defined at a nominal dose as defined by a given exposure system and patterning material and is modified during the exposure based on the mapped attribute file. This embodiment allows an alternative method of dose assignment which reduces the total number of instructions required for the exposure system. As in the first embodiment, this approach allows for continuous scale compensation increments without reducing hierarchy or design grid.

While the invention has been described in terms of a two illustrative embodiments, those skilled in the art will recognize that the invention can be practiced with modification within the spirit and scope of the appended claims.

Having thus described our invention, what we claim as new and desire to secure by Letters Patent is as follows:

1. A continuous scale optical proximity correction mask maker system comprising:

a computer aided design (CAD) data file of a pattern to be optically formed and replicated on a substrate;

a source of distortion knowledge generated based on feature analysis of the pattern, features of the pattern being analyzed based on varying dimensions, distance to nearest neighbor, etch loading environments, or any pattern transfer parameter which effects a specific shape's character;

an optical proximity correction (OPC) engine receiving said CAD data file and accessing said source of distortion knowledge, said OPC engine fracturing the CAD data file into a plurality of subsets of data described by unique data level names and retaining original design grid increment and allowing for hierarchy retention and prevention of data volume increases, said OPC engine assigning a specific dose to each data level in a manner that allows for a continuous scale of compensation increments for correction of image distortion; and a mask data generator receiving said plurality of subsets of data and doses for each data level and generating a compensated mask data set.

2. A continuous scale optical proximity correction mask maker as recited in claim 1 wherein the OPC engine is a rules-based system and said source of distortion knowledge is a lookup table.

3. A continuous scale optical proximity correction mask maker as recited in claim 1 wherein the OPC engine is a convolution-based system and said source of distortion knowledge is a convolution function.

4. A continuous scale optical proximity correction mask maker system comprising:

a computer aided design (CAD) data file of a pattern to be optically formed and replicated on a substrate;

a source of distortion knowledge generated based on feature analysis of the pattern, features of the pattern being analyzed based on varying dimensions, distance to nearest neighbor, etch loading environments, or any pattern transfer parameter which effects a specific shape's character;

an optical proximity correction (OPC) engine receiving said CAD data file and accessing said source of distortion knowledge, said OPC engine generating a mapped attribute file defining a hierarchical dose offset matching the CAD data file; and a mask data generator receiving said CAD data file and said attribute file and mapping a mask exposure level defined at a nominal dose for a given exposure system and patterning material and modified during exposure based on the mapped attribute file in a manner that allows for a continuous scale of compensation increments for correction of image distortion.

5. A continuous scale optical proximity correction mask maker as recited in claim 4 wherein the OPC engine is a rules-based system and said source of distortion knowledge is a lookup table.

6. A continuous scale optical proximity correction mask maker as recited in claim 4 wherein the OPC engine is a convolution-based system and said source of distortion knowledge is a convolution function.

7. A method of generating a continuous scale optical proximity correction in a mask maker system comprising the steps of:

generating a computer aided design (CAD) data file of a pattern to be optically formed and replicated on a substrate;

generating a source of distortion knowledge generated based on feature analysis of the pattern, features of the pattern being analyzed based on varying dimensions, distance to nearest neighbor, etch loading environments, or any pattern transfer parameter which effects a specific shape's character;

receiving said CAD data file and fracturing the CAD data file into a plurality of subsets of data described by unique data level names and retaining original design grid increment and allowing for hierarchy retention and prevention of data volume increases;

accessing said source of distortion knowledge and assigning a specific dose to each data level in a manner that allows for a continuous scale of compensation increments for correction of image distortion; and receiving said plurality of subsets of data and doses for each data level and generating a compensated mask data set.

8. A method of generating a continuous scale optical proximity correction in a mask maker system comprising the steps of:

generating a computer aided design (CAD) data file of a pattern to be optically formed and replicated on a substrate;

generating a source of distortion knowledge generated based on feature analysis of the pattern, features of the pattern being analyzed based on varying dimensions, distance to nearest neighbor, etch loading environments, or any pattern transfer parameter which effects a specific shape's character;

receiving said CAD data file and accessing said source of distortion knowledge to generate a mapped attribute file defining a hierarchical dose offset matching the CAD data file; and receiving said CAD data file and said attribute file and mapping a mask exposure level defined at a nominal dose for a given exposure system and patterning material and modified during exposure based on the mapped attribute file in a manner that allows for a continuous scale of compensation increments for correction of image distortion.

* * * * *